United States Patent
Drizlikh et al.

(10) Patent No.: US 7,101,787 B1
(45) Date of Patent: Sep. 5, 2006

(54) SYSTEM AND METHOD FOR MINIMIZING INCREASES IN VIA RESISTANCE BY APPLYING A NITROGEN PLASMA AFTER A TITANIUM LINER DEPOSITION

(75) Inventors: Sergei Drizlikh, Scarborough, ME (US); Thomas John Francis, South Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/821,491

(22) Filed: Apr. 9, 2004

(51) Int. Cl.
*H01L 21/4763* (2006.01)

(52) U.S. Cl. .................. 438/636; 438/658; 438/659; 438/660; 438/685; 438/783; 438/784; 438/785

(58) Field of Classification Search ........... 438/636, 438/658–660, 685, 783–785
See application file for complete search history.

(56) References Cited

U.S. PATENT DOCUMENTS

| | | | |
|---|---|---|---|
| 5,289,035 A * | 2/1994 | Bost et al. ............. 257/750 |
| 5,427,666 A * | 6/1995 | Mueller et al. ........ 204/192.17 |
| 5,892,282 A | 4/1999 | Hong et al. |
| 5,963,828 A | 10/1999 | Allman et al. |
| 5,985,763 A | 11/1999 | Hong et al. |
| 6,046,104 A | 4/2000 | Kepler |
| 6,060,132 A * | 5/2000 | Lee ................. 427/579 |
| 6,150,252 A | 11/2000 | Hsu et al. |
| 6,176,983 B1 | 1/2001 | Bothra et al. |
| 6,217,721 B1 * | 4/2001 | Xu et al. ............ 204/192.17 |
| 6,287,959 B1 * | 9/2001 | Lyons et al. .......... 438/636 |
| 6,383,947 B1 * | 5/2002 | Besser et al. ........ 438/758 |
| 6,399,508 B1 * | 6/2002 | Ting et al. .......... 438/706 |
| 6,410,383 B1 * | 6/2002 | Ma ................. 438/247 |
| 6,465,348 B1 * | 10/2002 | Wang .............. 438/681 |
| 6,544,882 B1 * | 4/2003 | Liu et al. ........... 438/622 |
| 6,569,751 B1 | 5/2003 | Tripathi et al. |
| 6,649,518 B1 * | 11/2003 | Selsley ............. 438/643 |
| 6,656,831 B1 * | 12/2003 | Lee et al. .......... 438/627 |

\* cited by examiner

*Primary Examiner*—Lynne A. Gurley

(57) ABSTRACT

A system and method is disclosed for minimizing increases in via resistance by applying a nitrogen plasma after a titanium liner deposition. A via in a semiconductor device is formed by placing a metal layer on a substrate and placing a layer of anti-reflective coating (ARC) titanium nitride (TiN) over the metal layer. A layer of dielectric material is placed over the ARC TiN layer and a via passage is etched through the dielectric and partially through the ARC TiN layer. A titanium layer is then deposited and subjected to a nitrogen plasma process. The nitrogen plasma converts the titanium layer to a first layer of titanium nitride. The first layer of titanium nitride does not react with fluorine to form a high resistance compound. Therefore the electrical resistance of the first layer of titanium nitride does not significantly increase during subsequent thermal cycles.

20 Claims, 4 Drawing Sheets

SYSTEM AND METHOD FOR MINIMIZING INCREASES IN VIA RESISTANCE BY APPLYING A NITROGEN PLASMA AFTER A TITANIUM LINER DEPOSITION

TECHNICAL FIELD OF THE INVENTION

The present invention is generally directed to manufacturing technology for semiconductor devices and, in particular, to a system and method for minimizing increases in via resistance during the manufacture of a semiconductor device.

BACKGROUND OF THE INVENTION

It is common for the electrical resistance of a via in a semiconductor device to increase slightly after a process induced thermal cycle such as a film deposition. However, a via in certain types of prior art semiconductor devices can sometimes exhibit a significant increase in via resistance during a subsequent thermal cycle. In some cases the increase in the electrical resistance of a via can range from twenty percent (20%) up to as much as one hundred fifty percent (150%). In addition, a via in some types of prior art semiconductor devices can also sometimes significantly expand in volume after a process induced thermal cycle.

One cause of the observed increase in the electrical resistance of the via and the observed volume expansion of the via is the presence of a fluorine contaminant embedded in a layer of anti-reflective coating (ARC) titanium nitride (TiN) in the semiconductor device. The fluorine contaminant becomes embedded in the ARC TiN layer during an etch process for a via passage that partially etches into the ARC TiN layer. The fluorine chemically reacts with a layer of titanium during subsequent thermal process steps to form a titanium fluoride compound.

The titanium fluoride compound exhibits an increased electrical resistance and an increase in volume. The presence of the titanium fluoride compound increases the electrical resistance of the via. In addition, the presence of the titanium fluoride compound contributes to an undesirable increase in via volume.

Therefore, there is a need in the art for a system and method for minimizing increases in via resistance during the manufacture of a semiconductor device. There is also a need in the art for a system and method for ensuring that a fluorine contaminant will not chemically react to form a titanium fluoride compound in a via of a semiconductor device.

SUMMARY OF THE INVENTION

To address the above-discussed deficiencies of the prior art, it is a primary object of the present invention to provide a system and method for minimizing increases in via resistance of a semiconductor device.

In one advantageous embodiment of the present invention a via in a semiconductor device is formed by placing a metal layer on a substrate and placing a layer of anti-reflective coating (ARC) titanium nitride (TiN) over the metal layer. A layer of dielectric material is then placed over the ARC TiN layer. A mask and etch procedure is then performed to etch through the layer of dielectric material and to etch partially through the ARC TiN layer. The etched portions of the dielectric material and the etch portions of the ARC TiN layer form a via passage.

A titanium layer is then deposited over the exposed portions of the layer of dielectric material and over the exposed portions of the ARC TiN layer. The titanium layer is then subjected to a nitrogen plasma process. The nitrogen plasma converts the titanium layer to a first layer of titanium nitride. The first layer of titanium nitride does not react with fluorine. Therefore any fluorine that may be present within the ARC TiN layer will not react with the first layer of titanium nitride. This means that the electrical resistance and volume of the first layer of titanium nitride will not significantly increase during subsequent thermal cycles.

A second layer of titanium nitride is then deposited on the first layer of titanium nitride. Then a layer of tungsten is deposited on the second layer titanium nitride. The layer of tungsten fills the via passage to form an electrical connection between the metal layer that is located under the layer of dielectric material and the tungsten layer that is located over the layer of dielectric material.

It is an object of the present invention to provide a system and method for minimizing increases in via resistance of a semiconductor device.

It is also an object of the present invention to provide a system and method for minimizing increases in via resistance of a semiconductor device by applying a nitrogen plasma after a titanium liner deposition.

It is yet another object of the present invention to provide a system and method for minimizing increases in via resistance of a semiconductor device by applying a nitrogen plasma to a layer of titanium material to covert the layer of titanium material to a first layer of titanium nitride.

It is still another object of the present invention to provide a system and method for minimizing increases in via resistance of a semiconductor device by applying a nitrogen plasma to a layer of titanium material to covert the layer of titanium material to a first layer of titanium nitride so that fluorine will not chemically react with the first layer of titanium nitride.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
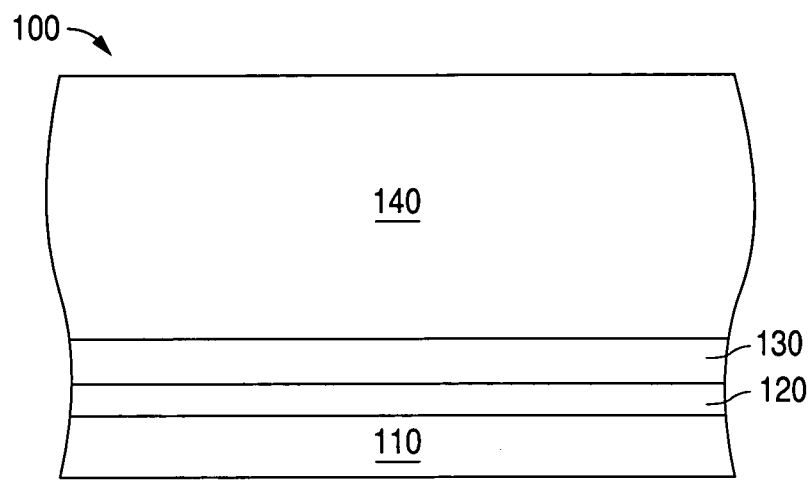
FIG. 1 illustrates a prior art structure of a semiconductor device in which a via is to be formed comprising a substrate, a metal layer, an anti-reflective coating (ARC) titanium nitride (TiN) layer, and a dielectric layer.

FIGS. 1 through 11, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

To simplify the drawings the reference numerals from previous drawings may sometimes not be repeated for structures that have already been identified.

FIG. 1 illustrates a prior art structure 100 of a semiconductor device in which a via is to be formed. Prior art structure 100 comprises a substrate 110. A metal layer 120 is placed on the substrate 110. Metal layer 120 serves as an interconnect metal that will connect the via (not shown in FIG. 1) to other portions of the semiconductor device. An anti-reflective coating (ARC) titanium nitride (TiN) layer 130 is then placed on metal layer 120. A dielectric layer (e.g., silicon dioxide) is then placed on the ARC TiN layer 130.

Figure 2:
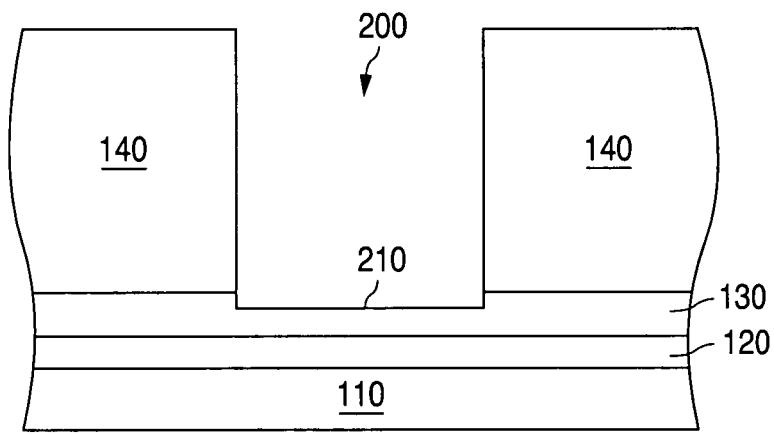
FIG. 2 illustrates the prior art structure shown in FIG. 1 in which an opening for a via has been etched through the dielectric layer and partially etched through the ARC Tin layer.

Then a mask and etch procedure is employed to etch a via passage 200 through the prior art structure shown in FIG. 1. As shown in FIG. 2, the via passage 200 extends through the dielectric layer 140 and partially into ARC TiN layer 130. The horizontal surface of the ARC TiN layer 130 that forms the base of via passage 200 is designated with reference numeral 210. After the via passage 200 has been etched, the via passage 200 is subjected to a via cleaning process.

Figure 3:
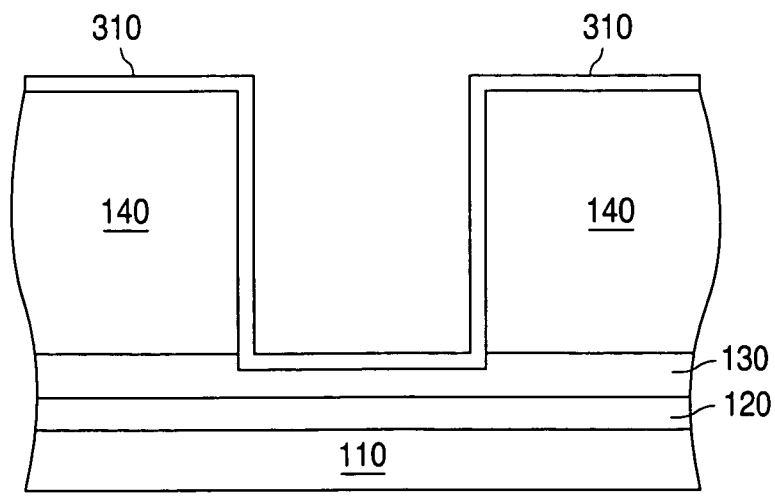
FIG. 3 illustrates the prior art structure shown in FIG. 2 in which a layer of titanium has been applied to the exposed surfaces of the dielectric layer and to the exposed surface of the ARC TiN layer.

Then a layer of titanium is applied to the surfaces of via passage 200. FIG. 3 illustrates the prior art structure shown in FIG. 2 in which a layer of titanium 310 has been applied to the exposed surfaces of the dielectric layer 140 and to the exposed surface 210 of the ARC TiN layer 130. The layer of titanium 310 is deposited by an Ionized Metal Plasma (IMP) procedure in a prior art titanium liner deposition chamber (not shown). For clarity, the thickness of the layer of titanium 310 in FIG. 3 is not necessarily drawn to scale.

Figure 4:
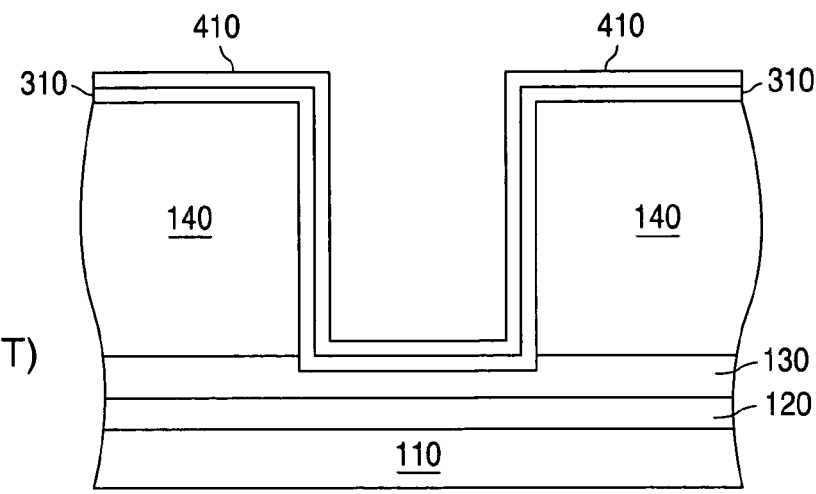
FIG. 4 illustrates the prior art structure shown in FIG. 3 in which a layer of titanium nitride (TiN) has been applied to the exposed surfaces of the layer of titanium.

Then a layer of titanium nitride (TiN) is applied to the surfaces of the layer of titanium 310. FIG. 4 illustrates the prior art structure shown in FIG. 3 in which the layer of titanium nitride (TiN) 410 has been applied to the exposed surfaces of the layer of titanium 310. The layer of titanium nitride 410 is deposited by a Chemical Vapor Deposition (CVD) procedure in a prior art titanium nitride (TiN) liner deposition chamber (not shown). In order for the CVD procedure to operate properly, the prior art structure shown in FIG. 3 must be heated in the CVD TiN chamber to a temperature of approximately four hundred degrees Centigrade (400° C.) in an atmosphere of neutral nitrogen or an atmosphere of a mixture of nitrogen and helium. The CVD procedure deposits the layer of titanium nitride 410 as shown in FIG. 4. For clarity, the thickness of the layer of titanium nitride 410 in FIG. 4 is not necessarily drawn to scale.

Figure 5:
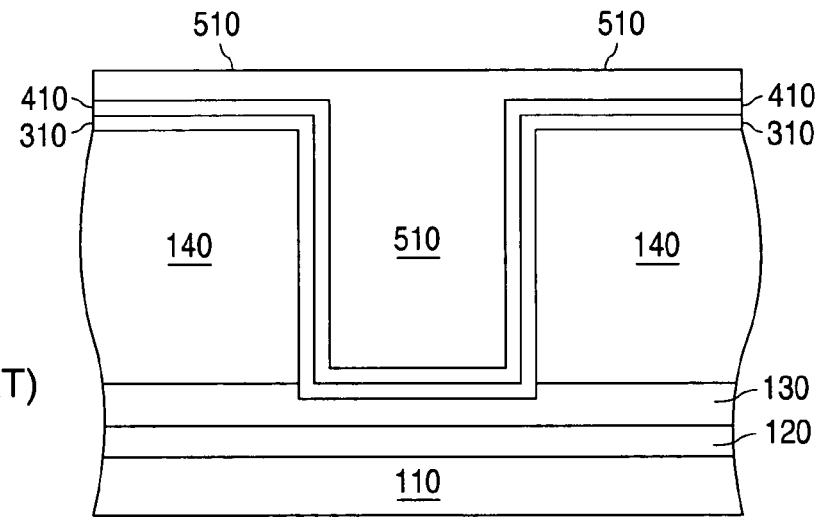
FIG. 5 illustrates the prior art structure shown in FIG. 4 in which a layer of tungsten has been applied to fill the via and to cover the exposed surfaces of the titanium layer.

In the next step, a layer of tungsten is deposited to fill the via passage 200. FIG. 5 illustrates the prior art structure shown in FIG. 4 in which a layer of tungsten 510 has been applied to fill the via passage 200 and to cover the exposed surfaces of the layer of titanium nitride 410. For clarity, the thickness of the layer of tungsten 510 in FIG. 5 is not necessarily drawn to scale. The layer of tungsten 510 that fills via passage 200 provides an electrical connection from the interconnect metal layer 120 that is located beneath the dielectric layer 140 (through ARC TiN layer 130, and through the layer of titanium 310, and through the layer of titanium nitride 410) to the portions of the layer of tungsten 510 are located above the dielectric layer 140.

The inventors of the present invention have discovered that prior art structures of the type illustrated in FIG. 5 sometimes display significant increases in via resistance during subsequent thermal cycles (e.g., film depositions). In some cases the increases in the electrical resistance of the via ranged from twenty percent (20%) up to as much as one hundred fifty percent (150%). In addition, the inventors of the present invention have discovered that prior art structures of the type illustrated in FIG. 5 also sometimes display significant volume expansion after the formation of the tungsten plug 510 within the via passage 200.

The inventors of the present invention have also discovered that one cause of the observed increase in the via resistance and the observed volume expansion is the presence of a contaminant embedded in the ARC TiN layer 130. The inventors have identified the contaminant as fluorine. The fluorine becomes embedded in the ARC TiN layer 130 during the via etch process that partially etches into the ARC TiN layer 130. The fluorine reacts with the layer of titanium 310 during subsequent thermal process steps to form a compound (e.g., a titanium fluoride compound). The compound so formed has an increased electrical resistance and volume expansion.

Figure 6:
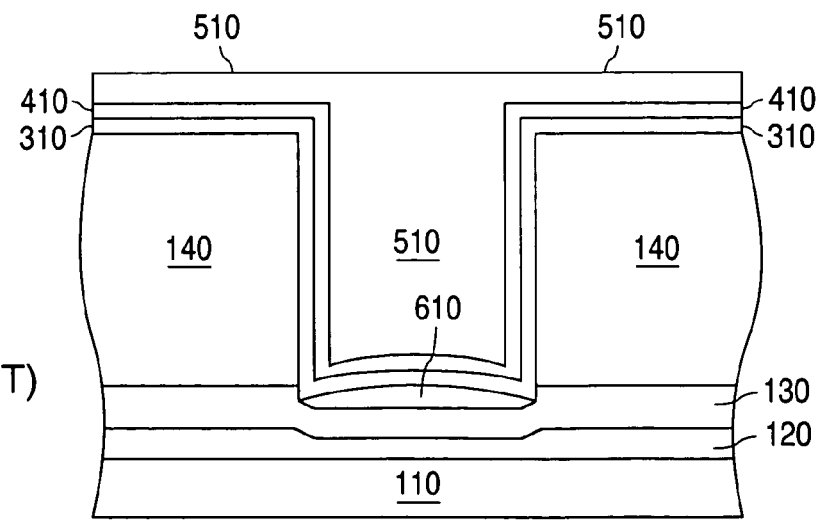
FIG. 6 illustrates the prior art structure shown in FIG. 5 in which a contaminant from the ARC TiN layer has reacted with the layer of tungsten and caused the titanium to turn into a compound that has a high resistance and an expanded volume.

FIG. 6 illustrates the prior art structure shown in FIG. 5 in which a fluorine contaminant in the ARC TiN layer 130 has reacted with the overlying layer of tungsten 310. The presence of fluorine has caused a portion of the layer of titanium 310 to turn into a titanium fluoride compound 610. The titanium fluoride compound 610 exhibits a high electrical resistance and an expanded volume. The volume expansion may deform the surrounding structures.

It is very desirable to be able to avoid the problems that are inherent in the types of prior art structures described above. The inventors of the present invention have discovered a system and method for minimizing the increases in via resistance and volume expansion.

Figure 7:
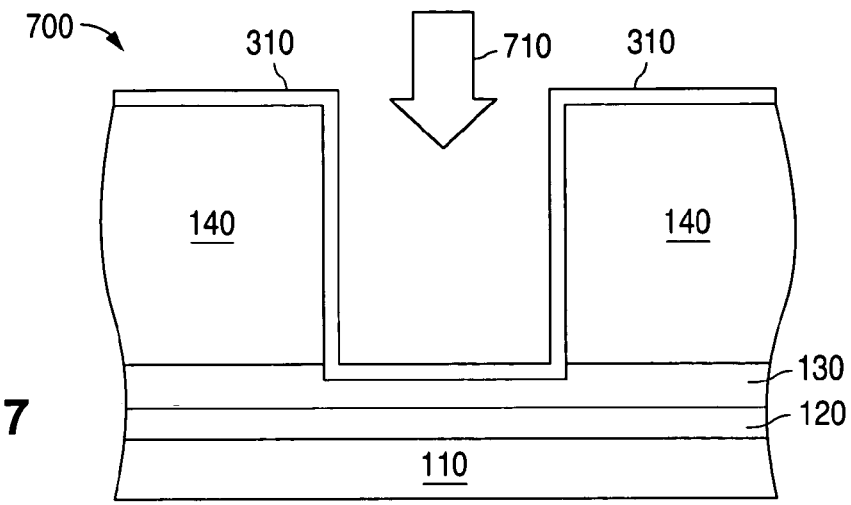
FIG. 7 illustrates an advantageous embodiment of the invention in which a nitrogen plasma is applied to the prior art structure shown in FIG. 3.

The construction of an advantageous embodiment of the present invention follows the steps of the prior art method up to the deposition of the layer of titanium 310. FIG. 7 illustrates an advantageous embodiment of the invention 700 that comprises the underlying prior art structure of FIG. 3. The method of the present invention differs from the prior art method in that a nitrogen plasma (N⁺) treatment is applied to the layer of titanium 310. The application of the nitrogen plasma is indicated in FIG. 7 by arrow 710. The application of the nitrogen plasma treatment heats the structure 700 to a temperature of approximately four hundred degrees Centigrade (400° C.). The plasma treatment performs the heating function of the prior art pre-heating step.

Figure 8:
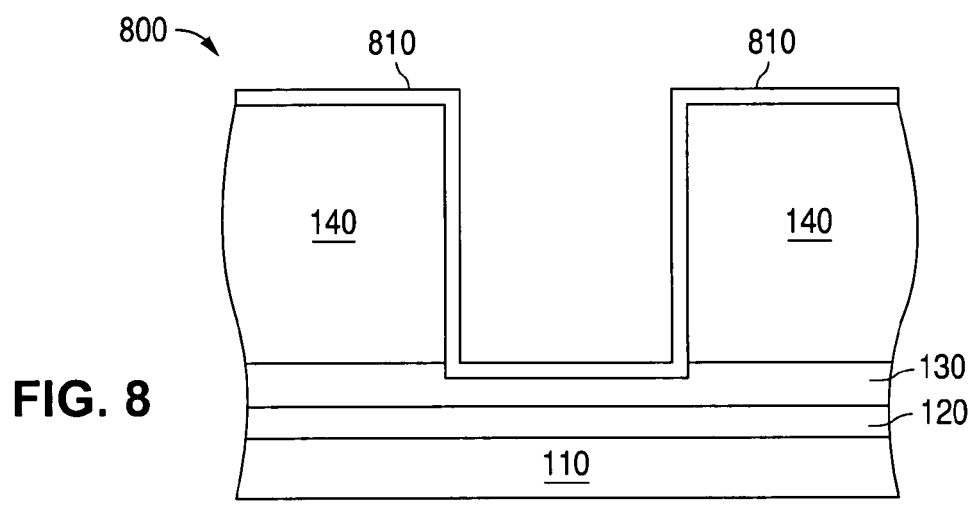
FIG. 8 illustrates an advantageous embodiment of a structure for forming a via in a semiconductor device in accordance with the principles of the invention in which the application of the nitrogen plasma has converted the layer of titanium (Ti) to titanium nitride (TiN)

The nitrogen plasma acts on the layer of titanium 310 and converts the layer of titanium 310 into a layer of titanium nitride (TiN). The layer of titanium nitride (TiN) is shown in FIG. 8 and designated with the reference numeral 810. The layer of titanium nitride (TiN) 810 may be referred to as a first layer of titanium nitride (TiN). For clarity, the thickness of the first layer of titanium nitride 810 in FIG. 8 is not necessarily drawn to scale. At this point an optional gas stabilization step may be performed before undertaking the next step of the method.

Figure 9:
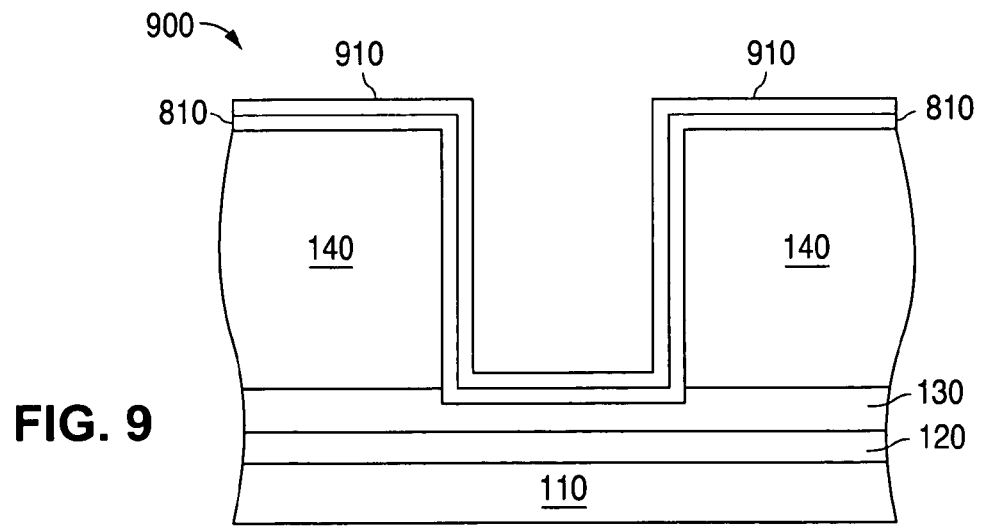
FIG. 9 illustrates the structure of the invention shown in FIG. 8 in which a second layer of titanium nitride (TiN) has been applied to the exposed surfaces of the first layer of titanium nitride (TiN)

Then a second layer of titanium nitride (TiN) is applied to the surfaces of the first layer of titanium nitride (TiN) 810. FIG. 9 illustrates the structure 800 shown in FIG. 8 in which a second layer of titanium nitride (TiN) 910 has been applied to the exposed surfaces of the first layer of titanium nitride (TiN) 810. The second layer of titanium nitride 910 is deposited by a Chemical Vapor Deposition (CVD) procedure in a prior art titanium nitride (TiN) liner deposition chamber (not shown). The CVD procedure deposits the second layer of titanium nitride 910 as shown in FIG. 9. For clarity, the thickness of the second layer of titanium nitride 910 in FIG. 9 is not necessarily drawn to scale.

Figure 10:
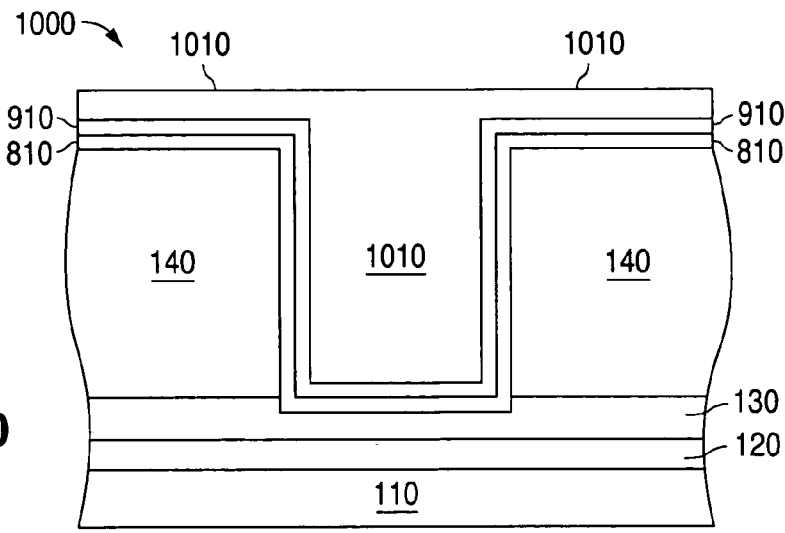
FIG. 10 illustrates the structure of the invention shown in FIG. 9 in which a layer of tungsten has been applied to fill the via and to cover the exposed surfaces of the second layer of titanium nitride (TiN)

In the next step, a layer of tungsten is deposited to fill the via passage. FIG. 10 illustrates the structure 900 shown in FIG. 9 in which a layer of tungsten 1010 has been applied to fill the via passage and to cover the exposed surfaces of the second layer of titanium nitride 910. For clarity, the thickness of the layer of tungsten 1010 in FIG. 10 is not necessarily drawn to scale. The layer of tungsten 1010 that fills via passage provides an electrical connection from the interconnect metal layer 120 that is located beneath the dielectric layer 140 (through ARC TiN layer 130, and through the first layer of titanium nitride 810, and through the second layer of titanium nitride 910) to the portions of the layer of tungsten 1010 are located above the dielectric layer 140.

The structure 1000 of the present invention illustrated in FIG. 10 does not display significant increases in via resistance during subsequent thermal cycles and does not display volume expansion. This is because the first layer of titanium nitride (TiN) 810 does not react with fluorine. Therefore any fluorine contaminant in the ARC TiN layer 130 will remain embedded in the ARC TiN layer 130. Unlike the prior art case, there will be no formation of a titanium fluoride compound. This means that there will be no significant increase in via resistance and no volume expansion during subsequent thermal cycles.

Figure 11:
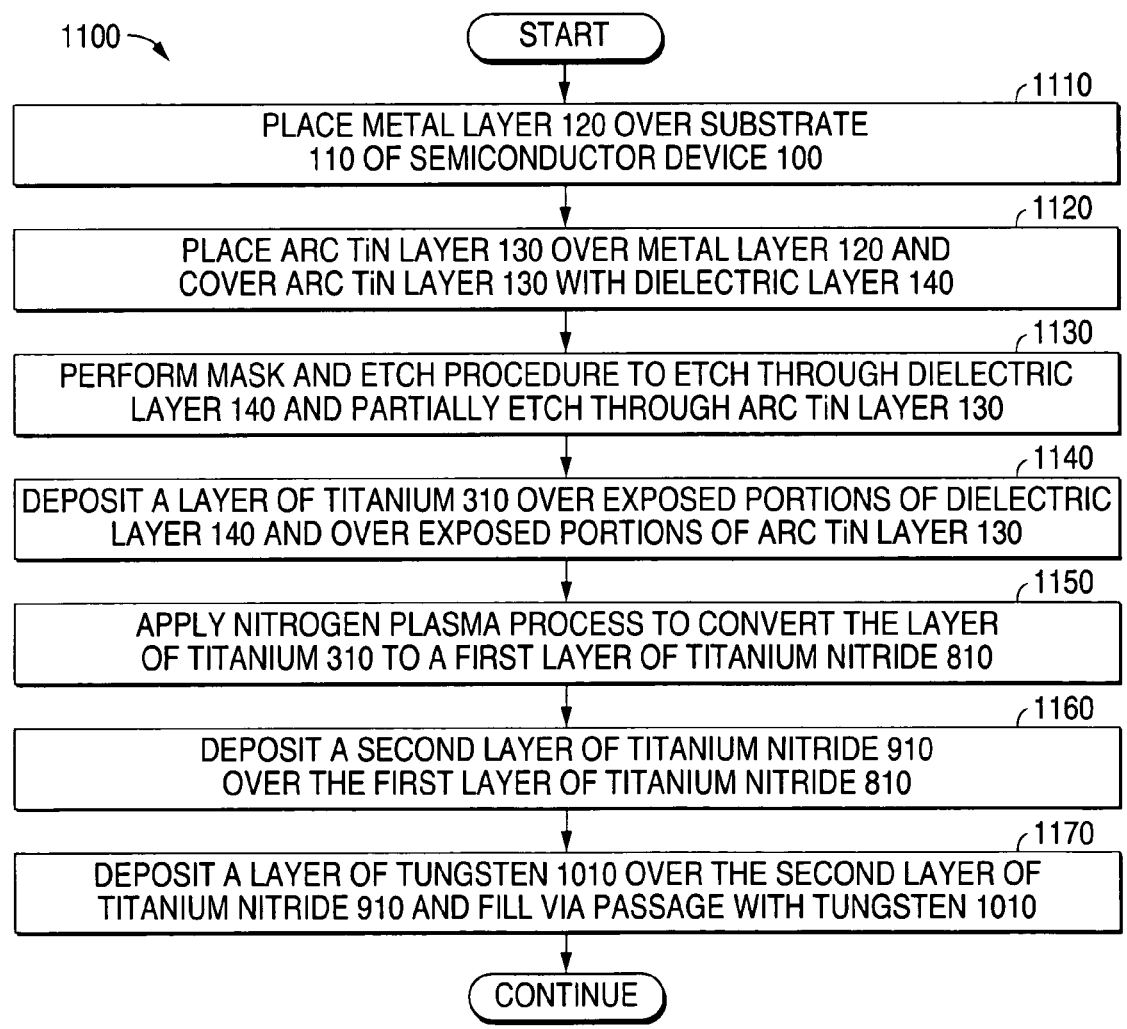
FIG. 11 illustrates a flow chart showing the steps of an advantageous embodiment of the method of the present invention.

FIG. 11 illustrates a flow chart 1100 showing the steps of an advantageous embodiment of the method of the present invention. The method of the present invention begins by providing a substrate 110 of a semiconductor device 100 and placing a metal layer 120 over the substrate 110 (step 1110). In the next step an anti-reflective coating (ARC) titanium nitride (TiN) layer 130 (ARC TiN layer 130) is deposited over the metal layer 120 and the ARC TiN layer 130 is covered with a dielectric layer 140 (step 1120). Then a mask and etch procedure is performed to etch through the dielectric layer 140 and to partially etch through the ARC TiN layer 130 (step 1130). Then a layer of titanium 310 is deposited over exposed portions of dielectric layer 140 and over exposed portions of the ARC TiN layer 310 (step 1140).

Then a nitrogen plasma (N⁺) process is applied to convert the layer of titanium 310 to a first layer of titanium nitride 810 (step 1150). Then a second layer of titanium nitride 910 is deposited over the first layer of titanium nitride 810 (step 1160). Then a layer of tungsten 1010 is deposited over the second layer of titanium nitride 910 and the via passage is filled with tungsten 1170 (step 1160). The method of the invention provides a via that exhibits no significant increase in electrical resistance and no significant volume expansion during subsequent thermal cycles.

Although the present invention has been described with an exemplary embodiment, various changes and modifications may be suggested to one skilled in the art. It is intended that the present invention encompass such changes and modifications as fall within the scope of the appended claims.

What is claimed is:

1. In a semiconductor device of the type comprising a via wherein said via comprises a layer of titanium placed over a layer of anti-reflective coating (ARC) titanium nitride, a method for preventing a contaminant within said layer of anti-reflective coating (ARC) titanium nitride from combining with portions of said layer of titanium, said method comprising the steps of:
    applying a nitrogen plasma to said layer of titanium; and
    converting said layer of titanium to a first layer of titanium nitride;
    wherein said contaminant does not chemically react with said first layer of titanium nitride.

2. The method as set forth in claim 1 wherein said contaminant within said layer of anti-reflective coating (ARC) titanium nitride is fluorine.

3. The method as set forth in claim 2 wherein said fluorine becomes embedded in said layer of anti-reflective coating (ARC) titanium nitride during a partial etch procedure of said layer of anti-reflective coating (ARC) titanium nitride.

4. The method as set forth in claim 1 wherein said step of applying said nitrogen plasma to said layer of titanium increases a temperature of said semiconductor device to a temperature of approximately four hundred degrees Centigrade.

5. The method as set forth in claim 1 further comprising the steps of:
depositing a second layer of titanium nitride over said first layer of titanium nitride;
depositing a layer of metal over said second layer of titanium nitride; and
filling said via passage with said layer of metal.

6. The method as set forth in claim 5 wherein said contaminant within said layer of anti-reflective coating (ARC) titanium nitride is fluorine.

7. The method as set forth in claim 1 wherein one of an electrical resistance of said first layer of titanium nitride and a volume of said first layer of titanium nitride does not significantly increase during a subsequent thermal cycle.

8. In a semiconductor device of the type comprising a via wherein said via comprises a layer of titanium placed over a layer of anti-reflective coating (ARC) titanium nitride, a method for preventing a contaminant within said layer of anti-reflective coating (ARC) titanium nitride from combining with portions of said layer of titanium, said method comprising the steps of:
providing a substrate for said semiconductor device;
placing a metal layer over said substrate;
placing a layer of anti-reflective coating (ARC) titanium nitride over said metal layer;
placing a dielectric layer over said layer of anti-reflective coating (ARC) titanium nitride;
performing a mask and etch procedure to etch through said dielectric layer and to partially etch through said layer of anti-reflective coating (ARC) titanium nitride to form a via passage;
depositing a layer of titanium over exposed portions of said dielectric layer and over exposed portions of said layer of anti-reflective coating (ARC) titanium nitride;
applying a nitrogen plasma to said layer of titanium; and
converting said layer of titanium to a first layer of titanium nitride wherein said contaminant does not chemically react with said first layer of titanium nitride.

9. The method as set forth in claim 8 wherein said contaminant within said layer of anti-reflective coating (ARC) titanium nitride is fluorine.

10. The method as set forth in claim 9 wherein said fluorine becomes embedded in said layer of anti-reflective coating (ARC) titanium nitride during a partial etch procedure of said layer of anti-reflective coating (ARC) titanium nitride.

11. The method as set forth in claim 8 wherein said step of applying said nitrogen plasma to said layer of titanium increases a temperature of said semiconductor device to a temperature of approximately four hundred degrees Centigrade.

12. The method as set forth in claim 8 wherein an electrical resistance of said first layer of titanium nitride does not significantly increase during a subsequent thermal cycle.

13. The method as set forth in claim 8 wherein a volume of said first layer of titanium nitride does not significantly increase during a subsequent thermal cycle.

14. The method as set forth in claim 8 further comprising the steps of:
depositing a second layer of titanium nitride over said first layer of titanium nitride;
depositing a layer of metal over said second layer of titanium nitride; and
filing said via passage with said layer of metal.

15. In a semiconductor device of the type comprising a via wherein said via comprises a layer of titanium placed over a layer of anti-reflective coating (ARC) titanium nitride, a method for preventing fluorine within said layer of anti-reflective coating (ARC) titanium nitride from combining with portions of said layer of titanium, said method comprising the steps of:
applying a nitrogen plasma to said layer of titanium; and
converting said layer of titanium to a first layer of titanium nitride;
wherein said fluorine does not chemically react with said first layer of titanium nitride.

16. The method as set forth in claim 15 wherein said fluorine becomes embedded in said layer of anti-reflective coating (ARC) titanium nitride during a partial etch procedure of said layer of anti-reflective coating (ARC) titanium nitride.

17. The method as set forth in claim 15 wherein said step of applying said nitrogen plasma to said layer of titanium increases a temperature of said semiconductor device to a temperature of approximately four hundred degrees Centigrade.

18. The method as set forth in claim 15 wherein an electrical resistance of said first layer of titanium does not significantly increase during a subsequent thermal cycle.

19. The method as set forth in claim 15 wherein a volume of said first layer of titanium nitride does not significantly increase during a subsequent thermal cycle.

20. The method as set forth in claim 15 further comprising the steps of:
depositing a second layer of titanium nitride over said first layer of titanium nitride;
depositing a layer of metal over said second layer of titanium nitride; and
filling said via passage with said layer of metal.

\* \* \* \* \*